United States Patent
Demange

(10) Patent No.: US 7,301,837 B2
(45) Date of Patent: Nov. 27, 2007

(54) ERROR TEST FOR AN ADDRESS DECODER OF A NON-VOLATILE MEMORY

(75) Inventor: Nicolas Demange, Saint-Maximin (FR)

(73) Assignee: STMicroelectronics SA, Montrouge (FR)

( * ) Notice: Subject to any disclaimer, the term of this patent is extended or adjusted under 35 U.S.C. 154(b) by 132 days.

(21) Appl. No.: 11/291,478

(22) Filed: Nov. 30, 2005

(65) Prior Publication Data

US 2006/0156193 A1     Jul. 13, 2006

(30) Foreign Application Priority Data

Nov. 30, 2004   (FR)  .................................. 04 12705

(51) Int. Cl.
  *G11C 7/00*   (2006.01)
  *G11C 7/06*   (2006.01)
  *G11C 7/10*   (2006.01)

(52) U.S. Cl. ............ 365/201; 365/189.06; 365/189.07; 365/189.11

(58) Field of Classification Search ................ 365/201, 365/189.06, 189.07, 189.11
See application file for complete search history.

(56) References Cited

U.S. PATENT DOCUMENTS 5,265,056 A  *  11/1993  Butler et al. ................ 365/201

FOREIGN PATENT DOCUMENTS

WO       WO 03/003379 A1     1/2003

* cited by examiner

*Primary Examiner*—Lý Duy Pham
(74) *Attorney, Agent, or Firm*—Hogan & Hartson LLP

(57) ABSTRACT

A non-volatile memory includes word lines providing access to memory cells, a word-line decoder applying an activation signal corresponding to an input address to a word line, a converter reproducing the activation signal on outputs by lowering its voltage level, and an encoding circuit that includes transistors with a switching threshold that is lower than the voltage level of the outputs and coupled so as to generate an output address specific to an activated word line if this word line is the only one activated, such that a test circuit generates an error signal if the input address differs from the output address. In such a configuration, the area of silicon occupied by a test circuit can be reduced.

22 Claims, 3 Drawing Sheets

ERROR TEST FOR AN ADDRESS DECODER OF A NON-VOLATILE MEMORY

RELATED APPLICATION

The present invention claims priority of French Patent Application No. 0412705 filed Nov. 30, 2004, which is incorporated herein in its entirety by this reference.

FIELD OF THE INVENTION

The invention concerns non-volatile-memories such as EEPROMs, and in particular the error tests conducted on the decoders of such memories.

BACKGROUND OF THE INVENTION

FIG. 1 illustrates a pair of cells of an EEPROM according to the prior art. Cell 1 is composed of a selection transistor SG1 and a floating-gate transistor CG1. Transistor SG1 is intended to selectively block access to transistor CG1. Transistor CG1 is intended for the storage and reading of data. A second cell is composed of transistors SG2 and CG2 in a similar manner.

FIG. 2 illustrates such cells located in a memory plane 5. This memory plane accommodates two lines of two 2-bit words. Each column of the memory plane has one line CG<i> coupled to a column decoder. The signal from line CG<i> is selectively reproduced on the gates of the floating-gate transistors of a word line by means of an associate transistor SW. Each SW transistor is rendered conducting through the activation of a word line WL, coupled to a word-line decoder. The DL<i> lines are coupled to a data-line decoder.

These decoders are subject to various types of malfunction as they leave the production line.

For an address supplied to a decoder, the latter is able to activate two lines or columns simultaneously. No line or column can activate an unwanted line or column. Tests are thus conducted at the end of the production process in order to detect the memories that have defective decoders.

To test the operation of these decoders, different types of tests are already known. In particular, it is common to use an ATE tester external to the EEPROM, to design the memory with a view to its DFT testability, or to use self-test circuits incorporated into the memory BIST. Examples of such tests include the diagonal test or the test known as the "Checkerboard test".

For the test of the diagonal, the technique includes programming the data words of the diagonal of the memory plane, and then reading the content of these words in order to determine if the addressing is correct. Since the programming can be affected only line by line, the testing time is significant, and involves a non-negligible additional memory production cost. As an example, for a 32 kB EEPROM with 512 lines, the programming time will typically be one second, and then the reading time will be 250 ms.

Manufacturers conventionally determine the cost of testing time in terms of silicon area. For example, for a memory in 0.18 $\mu$m technology, one second of test is equivalent to 0.02 $mm^2$. Test circuits intended to reduce the testing time must therefore not occupy an area greater than the area equivalent to the time that they save.

Document WO03-003379 describes an EEPROM equipped with self-test circuits, intended to eliminate the programming stage of the test phase. To this end, additional cells are coupled to the word lines. These additional cells apply predetermined address data in the place of the cells of the memory plane, in order to avoid line-by-line programming of the cells of the memory plane. In this document, the additional cells are EEPROM memory cells transformed into ROM by the elimination or not of their bit-line contact.

Such an EEPROM nevertheless has drawbacks. In fact, the additional cells still occupy a non-negligible area of the substrate, which increases the cost of the EEPROM.

SUMMARY OF THE INVENTION

The non-volatile memory of the present invention includes bit lines and word lines providing access to electrically erasable and programmable memory cells of a memory plane. The memory further includes a word-line decoder for receiving an input address applies a corresponding activation signal to a word line and a converter with inputs coupled to the word lines, reproducing the activation signal of each of these inputs on outputs by lowering its voltage level. The memory also includes an encoding circuit that includes transistors whose switching threshold is lower than the voltage level of the output activation signal, these transistors being coupled so as to generate an output address specific to an activated word line if this word line is the only one activated, and a test circuit which generates an error signal if the input address differs from the output address.

According to a variant of the present invention, the memory is of the EEPROM type, and the converter is an adaptation of a closure circuit located at the edge of the memory plane.

In another variant, the converter includes a test line whose voltage level is lower than the voltage level of the activation signals and a transistor for each word line, whose control electrode is coupled to an associate word line, of which another electrode is coupled to the test line, and of which still another electrode forms one of the said outputs of the converter.

According to yet another variant, the encoding circuit includes other transistors whose switching threshold is lower than the voltage level of the output activation signal, these transistors being coupled so as to generate the complement of the said output address, this complement of the output address being specific to an activated word line if this word line is the only one activated. The encoding circuit also includes a first AND function between the bits of the same significance of the addresses of the word lines activated simultaneously; a second AND function between the bits of the same significance of the complements of the addresses of the word lines activated simultaneously; and a comparator between the bits of the same significance resulting from the first and second AND functions. The test circuit generates an error signal if the comparator determines two identical bits of the same significance.

The test circuit preferably generates an error signal representing the simultaneous activation of several word lines when the said two identical bits of the same significance are at a zero data state.

It is also preferred that the test circuit should generate an error signal representing the absence of activation of a word line when the said two identical bits of the same significance are at a logic one data state.

According to a variant, for each address generation or address complement generation transistor, the gate is coupled to a respective output of the converter, a first electrode is coupled to a precharge circuit associated with an address or address complement bit, and a second electrode is coupled to an input of the comparator.

According to another variant, the memory includes a time multiplexer of the connection between the outputs of the converter and the address generation transistors, so that the address generation transistors sequentially generate a part of the address specific to the line activated.

According to another variant, the memory includes a time multiplexer of the connection between the outputs of, the converter and the transistors for generation of the address complement, so that the transistors for generation of the address complement sequentially generate a part of the complement of the address specific to the line activated.

BRIEF DESCRIPTION OF THE DRAWINGS

The invention will be better understood on reading the description that follows, with reference to the appended drawings in which.

DETAILED DESCRIPTION

The present invention applies an address of a word line to be tested to a decoder. A non-volatile memory possesses a converter whose inputs are coupled to the word lines of the non-volatile memory. At each output, the converter reproduces the activation signal of a corresponding input, by lowering its voltage level. The outputs are coupled to low-switching-threshold transistors of an encoding circuit. Low-switching-threshold transistors are of the "low voltage" type and therefore are smaller in size. These transistors then generate an output address. This output address is compared with the input address, and an error signal is generated when these two addresses differ.

Thus, the test advantageously dispenses with the memory cell programming stage, and the circuits necessary to implement the test occupy only a very small area of the substrate.

Figure 1:
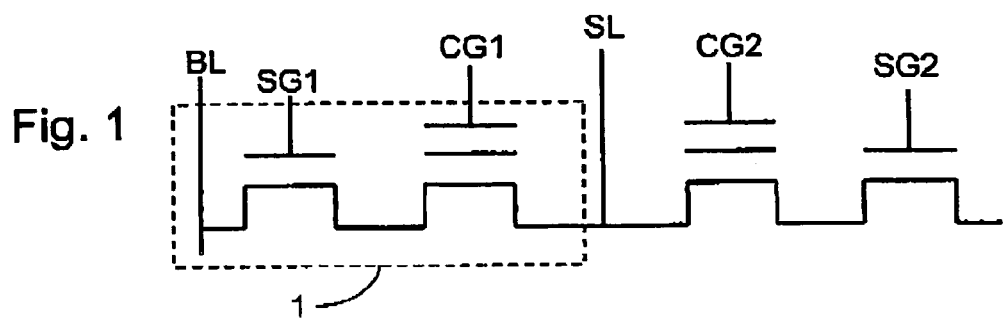
FIG. 1 is a schematic diagram of a pair of memory cells of one example of an EEPROM according to the prior art.
Figure 2:
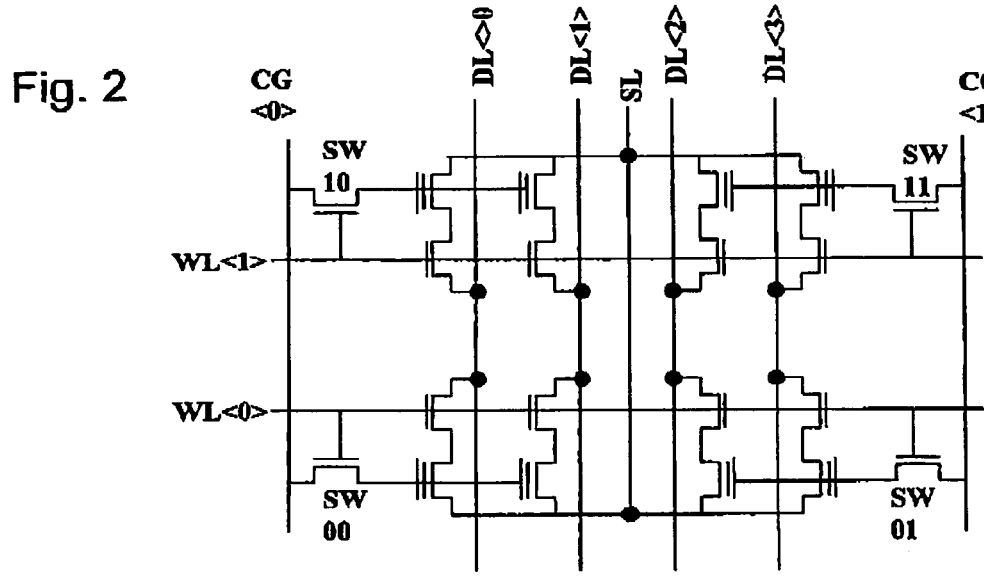
FIG. 2 is a schematic diagram of a memory plane of an EEPROM, together with its decoders according to the prior art.
Figure 3:
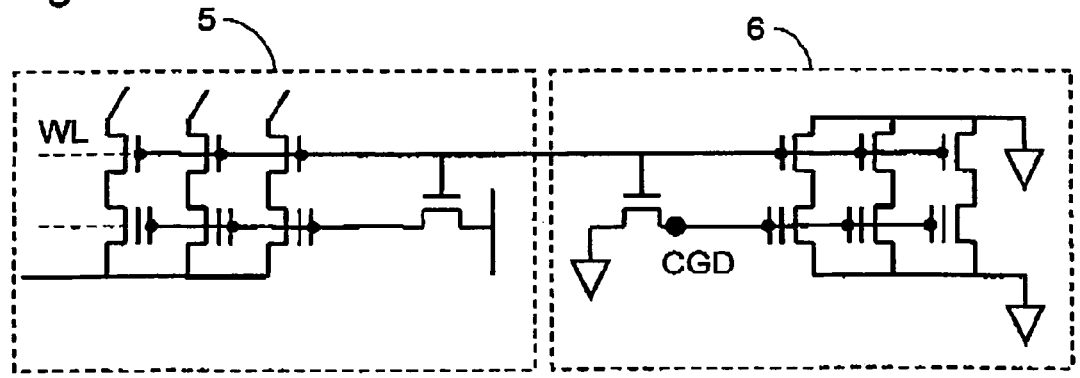
FIG. 3 is a schematic diagram of a memory plane, and closure circuits located at the edge of this plane, in accordance with the prior art.
Figure 4:
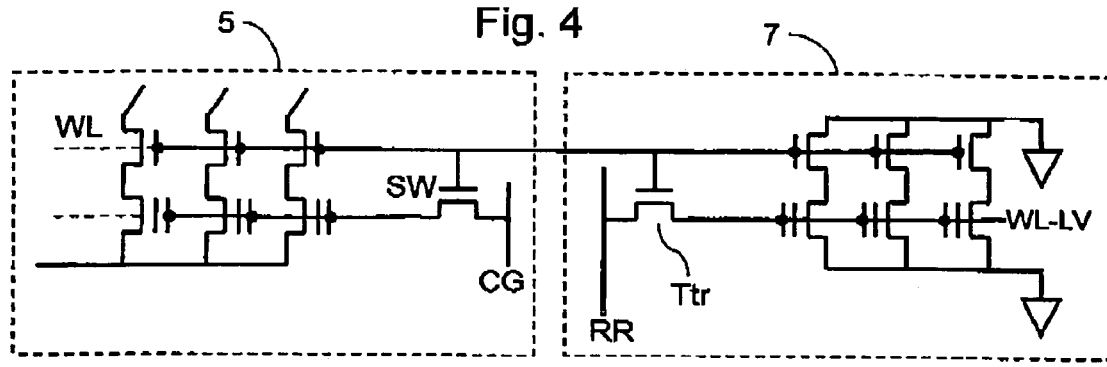
FIG. 4 is a schematic diagram of a memory plane and the closure circuits of FIG. 3 transformed into a low-voltage converter according to an embodiment of the invention.

FIG. 4 provides an example of a converter used according to the invention. An EEPROM has a memory plane 5 and a high-to-low voltage converter 7. In a manner which is already familiar, bit lines and word lines provide access to electrically erasable and programmable memory cells of the memory plane. Each word line of the memory plane 5 is coupled to a respective input of the converter 7. The converter 7 is created by the adaptation of closure transistors normally provided at the edge of the memory plane as shown in FIG. 3.

A transformation transistor Ttr is coupled to an input of the converter, and therefore to a word line of the memory plane. The word line WL illustrated is coupled to the gate of the NMOS transformation transistor Ttr. A signal RR is applied to the drain of the transistor Ttr via a test line. The source of transistor Ttr is coupled to a low-voltage output line WL_LV.

Signal RR is a test signal, activating the voltage converter 7. Signal RR has a voltage level Vdd that is distinctly lower than the voltage level of the activation signal applied to the gate of transistor Ttr by the line WL. As an example signal RR is at the low-voltage level of the memory on the order of 1.8 V, for example. When an activation signal is applied to the gate of a transistor Ttr, this transistor is rendered conducting and is switched on. The voltage of signal RR is therefore reproduced on the source of transistor Ttr, and therefore on line WL_LV. Line WL_LV thus reproduces the state of the signal on line WL with a lower voltage level. Signal RR is at Vss outside of the test phases.

Figure 5:
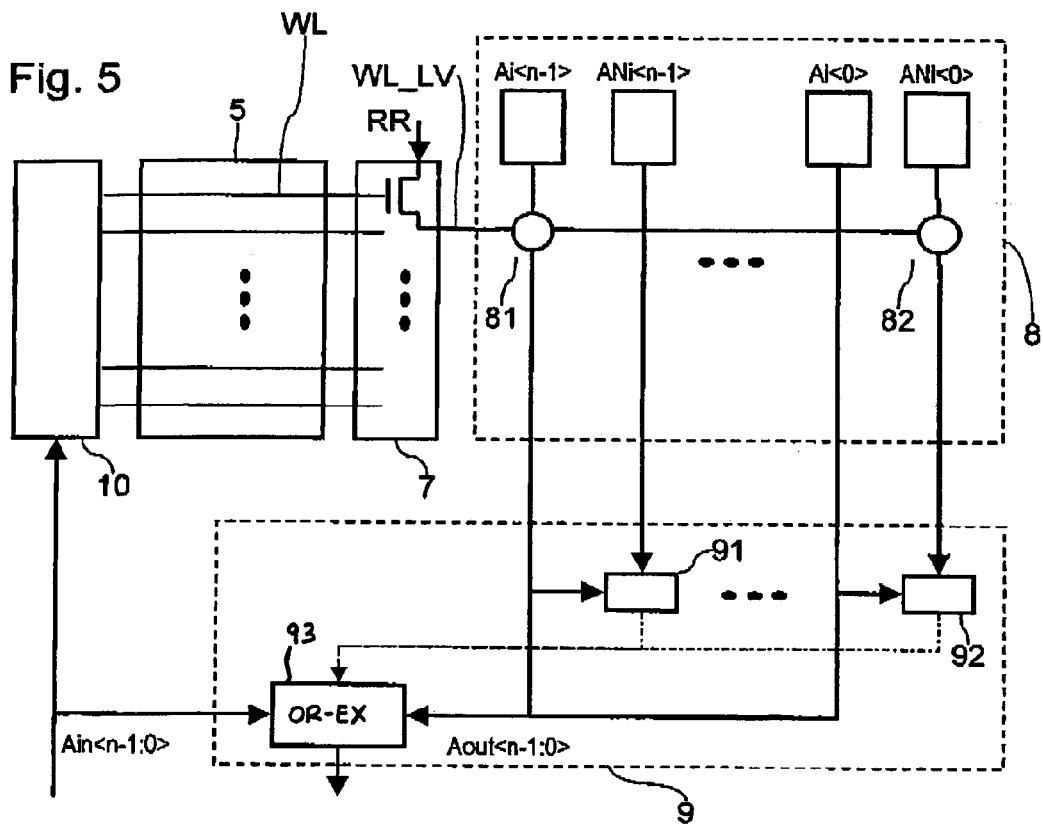
FIG. 5 is a schematic representation of an EEPROM according to an embodiment of the invention.

FIG. 5 schematically represents the memory according to the invention. The use of the low voltage level of line WL_LV allows the use of address generation transistors with a lower switching threshold and a minimum area, allowing the creation of an encoding circuit that occupies a smaller area of substrate. The memory has an encoding circuit 8 coupled to the outputs of the converter 7. This encoding circuit 8 is thus equipped with address generation transistors whose switching threshold is lower than the voltage level of the activation signal of line WL_LV. These transistors have a connection generating an output address that is specific to a word line if this word line is the only one activated.

In the example of FIG. 5, the output address associated with a word line is generated by address generation transistors (discharge transistors) associated with high-excursion precharge circuits. Each precharge circuit is associated with a bit of the output address to be generated: Circuit Ai<n−1> is thus associated with bit n−1, circuit Ai<n−2> is associated with bit n−2, and so on. A unique combination of the connections of a line WL_LV with precharge circuits Ai<n−1> to Ai<0> by means of the address generation transistors thus determines the output address. Each precharge circuit is composed, for example, of a resistance coupled to Vdd or of a cyclically charged PMOS transistor.

Figure 6:
FIG. 6 is a detailed schematic diagram of the connections of a decoding transistor according to an embodiment of the invention.

FIG. 6 illustrates the connections of a discharge transistor 81 used for address generation. Its gate is coupled to line WL_LV, its source is coupled to ground, and its drain is coupled to precharge circuit Ai. The source of transistor 82 is intended for reading the value of bit Ai. The discharge transistors are preferably of the NMOS type, in order to reduce the discharge time.

The connection of a line WL_LV to an address generation transistor corresponds to the zero data value of the associated bit. Non-connection of a line WL_LV to an address generation transistor corresponds to the one data value of the associated bit.

The example of FIG. 5 shows the connections of a single word line WL. The source of the conversion transistor Ttr is coupled to the gate of transistor 81. The drain of transistor 81 is coupled to precharge circuit Ai<n−1>. This connection therefore codes one bit at a zero data state on this word line. In contrast, no discharge transistor couples the source of transistor Ttr to pre-charge circuit Ai<0>. This absence of connection therefore codes one bit to a one data state on this word line.

The operation to test the addressing of memory is as follows—an address Ain<n−1:0> is applied to the input of an address decoder 10. In the absence of any malfunction, the decoder then applies an activation signal to the corresponding word line. This word line is activated, and the aim of a first test is to check that this line actually corresponds to the input address. The corresponding address generation transistors generate the output address associated with the activated word line. The activation signal renders conducting the transistors coding a bit to a zero data state. These transistors then discharge the associated Ai nodes, and a logic zero level is then read for these bits. The Ai nodes not coupled to these transistors remain charged, and a logic level one is then read for these bits. The output address Aout<n−1:0> thus generated is then read by a test circuit 9. The test circuit 9 generates an error signal if the input address differs from the output address. The input address and the output address can be applied, for example, to the inputs of an OR-EX gate 93, whose output signal can be seen.

A non-activated word line has no incidence upon the encoding circuit. This word line does not render conducting the associated conversion transistor, and therefore cannot render conducting its discharge transistors.

It is also possible to observe that in a large number of cases, the output address will not correspond to the input address either if no word lines are activated or several are activated simultaneously.

The invention also allows the determination of error types other than an address coding error.

In the example of FIG. 6, the encoding circuit also includes transistors coupled to generate the complement of the output address. The complement generated is also specific to an activated word line if this word line is the only one activated.

It is preferable that these transistors should have the same characteristics as the address generation transistors. The complement of the output address is generated by a unique combination of the connections of a line WL_LV with precharge circuits ANi<n−1> to Ani<0> by means of the transistors for generation of the address complement. Each of the precharge circuits is associated with one bit of the complement of the address to be generated. The connection of a line WL_LV to a complement generation transistor corresponds to a zero data value of the associated bit, and non-connection corresponds to a one data value of the associated bit. A line WL_LV coupled to a precharge circuit Ai<j> is not coupled to a precharge circuit Ani<j> and vice versa.

In the example, discharge transistor 82 is associated with precharge circuit Ani<0>.

The discharge transistors of the different lines WL_LV and coupled to a given precharge circuit Ai are coupled in parallel. Likewise, the transistors coupled to a given precharge circuit Ani are coupled in parallel. If addresses are generated for different word lines activated simultaneously, such a connection provides an AND function between their bits of the same significance. Likewise, such a connection provides an AND function between the bits of the same significance of the different address complements generated. In fact, if several word lines are activated simultaneously, it suffices that one of them renders a discharge transistor conducting to force the state of the corresponding bit to zero.

The bits of the same significance of the output address and of the address complement are input to comparators. In the example, the n−1 bits are input to comparator 91 and the zero bits are input to comparator 92. The comparators can be composed of Excl-OR gates for example.

Thus if, and only if, a single word line is activated, no comparator determines bits of the same significance that have identical values.

If a comparator determines two identical bits of the same significance, two cases arise:

If these bits are identical and of value zero, this means that several word lines are activated simultaneously, where each word line has a distinct address, one word line generates a zero for at least one address bit, while another word line generates a zero for the bit of the same significance of the address complement;

If these bits are identical and of value one, this means that no word line is activated. Since no word line is activated, no discharge transistor is rendered conducting. As a consequence, the comparator reads only logic one states.

The test circuit can generate an error signal to suit each of these cases. To this end, it is only necessary to measure the value of the identical bits of the same significance applied to a comparator.

The error signals generated can either be transmitted to a self-test device incorporated into the memory or to a test machine outside the memory.

Although the invention has been presented previously with a logic associated with the use of AND functions, it is also possible to envisage using OR functions between the bits of the same significance of the addresses of word lines activated simultaneously.

Figure 7:
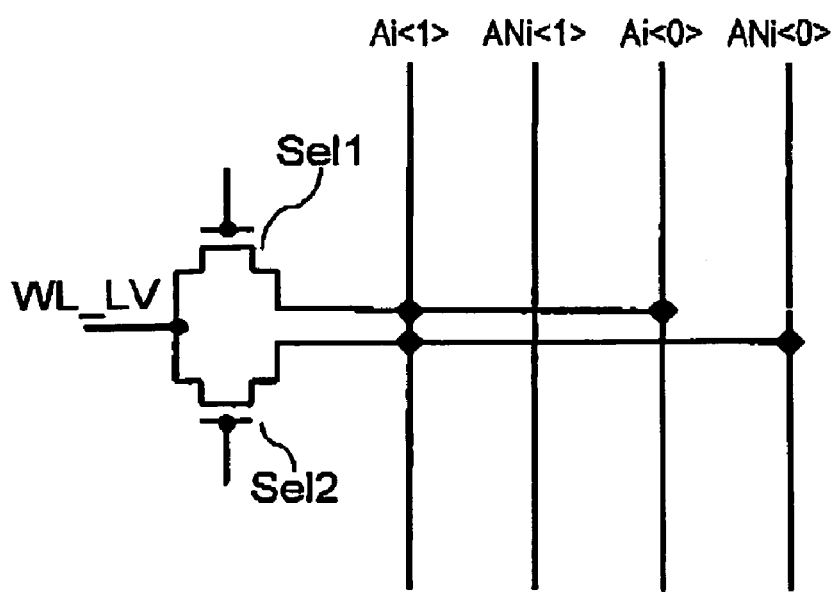
FIG. 7 is a schematic representation of a circuit used for time multiplexing of address portions according to an embodiment of the present invention.

FIG. 7 illustrates a variant of, the invention, allowing the number of precharge circuits and discharge transistors used to be reduced. To this end, time multiplexing of the connections between the outputs of the converter and the address generation or address complement generation transistors is effected. Each part of the address or of the address complement is then generated sequentially.

FIG. 7 illustrates an example of simplified time multiplexing. Activation of line WL_LV is programmed to generate address <0 0 0 1>. Transistor Se12 is cut off, and transistor Se11 is firstly rendered conducting to couple line WL_LV to the discharge transistors of nodes Ai<1> and Ai<0>. The test circuit thus firstly retrieves bits <0 0> of the first part of the address. Transistor Se11 is then cut off and transistor Se12 is rendered conducting to couple line WL_LV to the discharge transistors of nodes Ai<1> and Ani<0>. The test circuit then retrieves bits <0 1> of the second part of the address of the activated word line.

A given precharge circuit and a given discharge transistor can thus be used to code several bits of a generated address or of address complement. A significant saving of substrate area is thus achieved. For a high area ratio between an EEPROM cell and a low-voltage transistor, a space in the upper part of the memory plane can be used to incorporate the multiplexing transistors without increasing the area of silicon used.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

I claim:

1. A non-volatile memory comprising:
   bit lines and word lines providing access to electrically erasable and programmable memory cells of a memory plane;
   a word-line decoder receiving an input address and applying a corresponding activation signal to a word line;
   a converter with inputs coupled to the word lines, reproducing on outputs the activation signal of each of these inputs by lowering its voltage level;
   an encoding circuit including transistors whose switching threshold is lower than the voltage level of the output activation signal, these transistors being coupled to generate an output address, wherein the output address is specific to an activated word line if the word line is the only one activated; and
   a test circuit generating an error signal if the input address differs from the output address.

2. The memory according to claim 1, wherein the memory comprises an EEPROM.

3. The memory according to claim 1, wherein the converter comprises an adapted closure circuit located at the edge of the memory plane.

4. The memory according to claim 2, wherein the converter comprises:
   a test line whose voltage level is lower than the voltage level of the activation signals;
   a transistor for each word line, whose control electrode is coupled to an associated word line, of which another electrode is coupled to the test line, and of which yet another electrode forms one of the outputs of the converter.

5. The memory of claim 1 wherein the encoding circuit comprises:
   at least one additional transistor whose switching threshold is lower than the voltage level of the output activation signal, the at least one additional transistor being coupled to generate the complement of the output address, the output address complement being specific to an activated word line if this word line is the only one activated;
   a first AND function generator between the bits of the same significance of the addresses of the word lines activated simultaneously;
   a second AND function generator between the bits of the same significance of the complements of the addresses of the word lines activated simultaneously; and
   a comparator between the bits of the same significance resulting from the first and second AND functions.

6. The memory according to claim 5, wherein the test circuit generates an error signal if the comparator determines two identical bits of the same significance.

7. The memory according to claim 6, wherein the test circuit generates an error signal representing the simultaneous activation of several word lines when the two identical bits of the same significance are at a zero data state.

8. The memory according to claim 6, wherein the test circuit generates an error signal representing the absence of activation of a word line when the said two identical bits of the same significance are at a one data state.

9. The memory according to claim 6, wherein for each transistor for address generation or for address complement generation, the gate is coupled to a respective output of the converter, a first electrode is coupled to a precharge circuit associated with an address bit or address complement bit, and a second electrode is coupled to an input of the comparator.

10. The memory according to claim 6, further comprising a time multiplexer of the connection between the outputs of the converter and the address generation transistors, so that the address generation transistors sequentially generate a part of the address specific to the line activated.

11. The memory according to claim 6, further comprising a time multiplexer of the connection between the outputs of the converter and the address complement generation transistors, so that the address complement generation transistors sequentially generate a part of the complement of the address specific to the line activated.

12. A test circuit for a non-volatile memory comprising:
    a converter with inputs coupled to word lines of the memory, reproducing on outputs an activation signal of each of these inputs by lowering its voltage level;
    an encoding circuit including transistors whose switching threshold is lower than the voltage level of the output activation signal, these transistors being coupled to generate an output address, wherein the output address is specific to an activated word line if the word line is the only one activated; and
    a test circuit generating an error signal if the input address differs from the output address.

13. The memory according to claim 12, wherein the memory comprises an EEPROM.

14. The memory according to claim 12, wherein the converter comprises an adapted closure circuit located at the edge of a memory plane.

15. The memory according to claim 12, wherein the converter comprises:
    a test line whose voltage level is lower than the voltage level of the activation signals;
    a transistor for each word line, whose control electrode is coupled to an associated word line, of which another electrode is coupled to the test line, and of which yet another electrode forms one of the outputs of the converter.

16. The memory of claim 15 wherein the encoding circuit comprises:
    at least one additional transistor whose switching threshold is lower than the voltage level of the output activation signal, the at least one additional transistor being coupled to generate the complement of the output address, the output address complement being specific to an activated word line if this word line is the only one activated;
    a first AND function generator between the bits of the same significance of the addresses of the word lines activated simultaneously;
    a second AND function generator between the bits of the same significance of the complements of the addresses of the word lines activated simultaneously; and
    a comparator between the bits of the same significance resulting from the first and second AND functions.

17. The memory according to claim 16, wherein the test circuit generates an error signal if the comparator determines two identical bits of the same significance.

18. The memory according to claim 16, wherein the test circuit generates an error signal representing the simultaneous activation of several word lines when the two identical bits of the same significance are at a zero data state.

19. The memory according to claim 16, wherein the test circuit generates an error signal representing the absence of activation of a word line when the said two identical bits of the same significance are at a one data state.

20. The memory according to claim 16, wherein for each transistor for address generation or for address complement generation, the gate is coupled to a respective output of the converter, a first electrode is coupled to a precharge circuit associated with an address bit or address complement bit, and a second electrode is coupled to an input of the comparator.

21. The memory according to claim 16, further comprising a time multiplexer of the connection between the outputs of the converter and the address generation transistors, so that the address generation transistors sequentially generate a part of the address specific to the line activated.

22. The memory according to claim 16, further comprising a time multiplexer of the connection between the outputs of the converter and the address complement generation transistors, so that the address complement generation transistors sequentially generate a part of the complement of the address specific to the line activated.

* * * * *